(12) United States Patent
Haffner

(10) Patent No.: US 8,298,953 B2
(45) Date of Patent: Oct. 30, 2012

(54) METHOD FOR DEFINING A SEPARATING STRUCTURE WITHIN A SEMICONDUCTOR DEVICE

(75) Inventor: Henning Haffner, Pawling, NY (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/973,295

(22) Filed: Dec. 20, 2010

(65) Prior Publication Data

US 2012/0156881 A1 Jun. 21, 2012

(51) Int. Cl.
*H01L 21/31* (2006.01)
(52) U.S. Cl. .......... 438/703; 257/E21.023; 716/52; 716/54; 716/119
(58) Field of Classification Search .......... 438/703, 438/708, 711; 716/52, 54, 119; 430/311; 257/E21.023
See application file for complete search history.

(56) References Cited

U.S. PATENT DOCUMENTS

| | | | |
|---|---|---|---|
| 5,424,154 A | 6/1995 | Borodovsky | |
| 5,563,012 A | 10/1996 | Neisser | |
| 6,929,887 B1 | 8/2005 | Lin et al. | |
| 7,266,798 B2 | 9/2007 | Mansfield et al. | |
| 7,310,797 B2 | 12/2007 | Huckabay | |
| 7,785,946 B2 | 8/2010 | Haffner et al. | |
| 2009/0079005 A1* | 3/2009 | Haffner et al. | 257/368 |
| 2009/0081563 A1* | 3/2009 | Wang et al. | 430/5 |

* cited by examiner

*Primary Examiner* — William D Coleman
*Assistant Examiner* — Christine Enad
(74) *Attorney, Agent, or Firm* — Dicke, Billig & Czaja, PLLC

(57) ABSTRACT

A method includes depositing a material layer over a semiconductor substrate and using a first mask in a first exposure/patterning process to pattern the material layer thereby forming a plurality of first and second features. The first features include patterns for the semiconductor device and the second features include printing assist features. The method includes using a second mask in a second exposure/patterning process to effectively remove the second features from the material layer and to define at least one separating structure between two first features.

8 Claims, 13 Drawing Sheets

METHOD FOR DEFINING A SEPARATING STRUCTURE WITHIN A SEMICONDUCTOR DEVICE

BACKGROUND

Semiconductor devices are used in a variety of electronic applications, such as computers, cellular phones, personal computing devices, and many other applications. Home, industrial, and automotive devices that, in the past, comprised only mechanical components now have electronic parts that include semiconductor devices.

Semiconductor devices are manufactured by depositing many different types of material layers over a semiconductor workpiece or wafer, and patterning the various material layers using lithography amongst other processes. The material layers typically comprise thin films of conductive, semi-conductive, and insulating materials that are patterned and etched to form integrated circuits (ICs). There may be a plurality of transistors, memory devices, switches, conductive lines, diodes, capacitors, logic circuits, and other electronic components formed on a single die or chip.

There is a trend in the semiconductor industry towards reducing the size of features, e.g., the circuits, elements, conductive lines, and vias of semiconductor devices, to increase performance of the semiconductor devices, but also to reduce the manufacturing cost. The minimum feature size of semiconductor devices has steadily decreased over time. As features of semiconductor devices become smaller, however, it becomes more difficult to pattern the various material layers because of diffraction and other effects that occur during a lithography process. For example, key metrics such as resolution and depth of focus of the imaging systems may suffer when patterning features at small dimensions.

Innovative process solutions have been developed that overcome some of these limitations. Many such process solutions, however, also interact with subsequent steps and may degrade other equally important factors. For example, process modifications made, in the printing of minimum features during the lithography steps can seriously impact transistor performance or product yield.

For these and other reasons, there is a need for the present invention.

SUMMARY

One embodiment provides a method for fabricating a semiconductor device. The method includes depositing a material layer over a semiconductor substrate and using a first mask in a first exposure/patterning process to pattern the material layer thereby forming a plurality of first and second features. The first features include patterns for the semiconductor device and the second features include printing assist features. The method includes using a second mask in a second exposure/patterning process to effectively remove the second features from the material layer and to define at least one separating structure between two first features.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
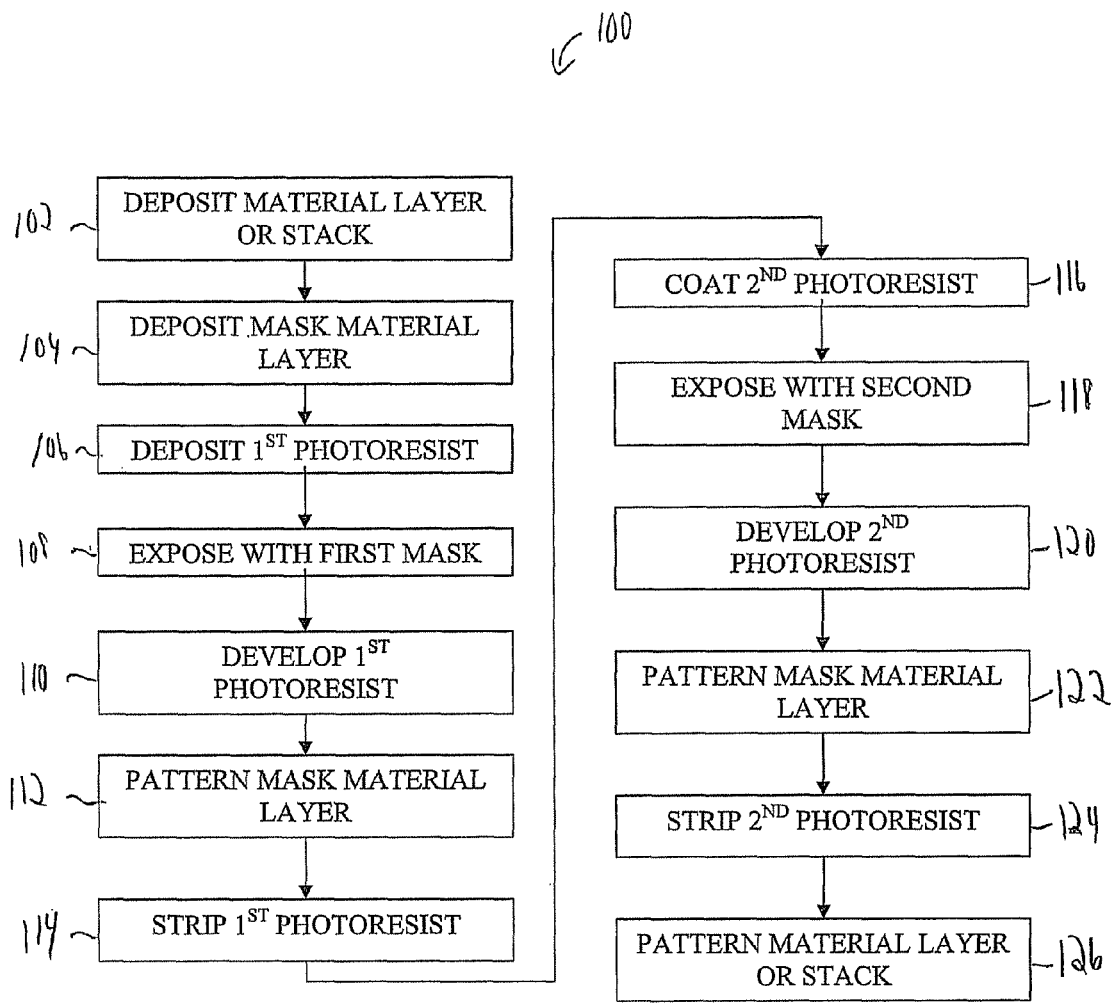
FIG. 1 is a flow diagram illustrating one embodiment of a method for fabricating a semiconductor device using a double patterning process.

In the following Detailed Description, reference is made to the accompanying drawings, which form a part hereof, and in which is shown by way of illustration specific embodiments in which the disclosure may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

Embodiments provide a method to transfer small, semi-isolated and isolated resist spaces as drawn by design onto a semiconductor wafer by opening the resist spaces with the second or a subsequent exposure of a double or multiple exposure/patterning process. The small resist spaces are typically at or close to the resolution limit of the exposure system. The opening of the resist spaces with the second or subsequent exposure/patterning process is instead of, or in addition to, opening of the resist spaces with the first exposure/patterning process of the double or multiple exposure/patterning process. By opening the small resist spaces with the second or subsequent exposure, the transfer robustness (i.e., the process window) of the resist spaces is improved. In other embodiments, the first exposure/patterning process and the second or subsequent exposure/patterning process are reversed to open the small resist spaces.

Embodiments are also applicable to forming resist trenches with a resist line in between trench openings. The method described above is applied but instead of removing material with the second or subsequent exposure/patterning process, the opposite is performed and additional deposited fill material is protected from being removed again in the second or subsequent exposure/patterning process.

A phenomenon referred to as proximity effect poses a primary challenge in transferring patterns during lithography. Proximity effects result in variation of line width of patterns, depending on the proximity of a feature to other features. Proximity effects arise during, for example, imaging, resist patterning, or subsequent transferring of the pattern, such as during etching. The magnitude of the effect typically depends on the proximity or closeness of the two features present on the mask. Proximity effects, however, can extend to longer distances extending to several micrometers especially for etch processes.

One of the reasons for the observed proximity effects arises from optical diffraction. Hence, adjacent features interact with one another to produce pattern-dependent variations. For example, for lithographic exposure, closely-spaced dark features (e.g., densely packed gates) tend to be wider into a positive tone resist than widely-spaced features (e.g., isolated gates), although on a lithography mask they comprise the same dimension. Similarly, during etch processes, the reverse is true, and hence closely-spaced features tend to be transferred smaller than widely-spaced features. It is important in many semiconductor device designs for features to have uniform, predictable dimensions across a surface of a wafer to achieve the desired device performance.

To compensate for such proximity effects, optical proximity corrections (OPC) are applied to mask layouts of lithographic photomasks, which may involve adjusting the widths or lengths of the lines on the mask. Advanced methods of OPC correct corner rounding and a general loss of fidelity in the shape of features by adding small secondary patterns, referred to as serifs, to the patterns.

In addition, sub-resolution assist features, also called scatter bars, are also added, which are features formed on the mask but are not patterned or printed. For example, sub-resolution assist features typically comprise a plurality of lines significantly thinner than the minimum patternable width or resolution of the exposure system. These assist features effectively change the pattern density and help improve depth of focus of the exposure system. Consequently, these assist features improve uniformity in printing features of different density, for example, between isolated and dense lines.

The use of scatter bars, however, is becoming increasingly difficult to implement. For example, the width of the scatter bars must be significantly smaller than the critical dimension of the minimum feature to avoid printing. Shrinking the critical dimension also shrinks the widths of scatter bars, thus increasing the difficulty of incorporating these features into the mask, as well as their subsequent inspection and repairs.

Further, the patterning of ever shrinking minimum features and especially pitches leads to aggressive increases in numerical aperture of the lithography system. Although higher numerical aperture increases resolution, the depth of focus degrades considerably. Consequently, the inclusion of sub-resolution assist features is not sufficient to improve depth of focus to a reasonable range suitable for production of future semiconductor nodes. Further improvements in depth of focus, however, can be made if the sub-resolution assist features are allowed to print. Such features, also called printing assist features, are now being explored.

Printing assist features, also called dummy features, are typically introduced in the layout to improve the quality of the transfer of neighboring, electrically active gates. These dummy features (if neighboring gate lines, also called dummy gates) would be transferred to the final chip layout on the wafer just like the neighboring, electrically active gates. For example, additional gate lines may be printed, for example, over isolation regions. Such dummy gate lines reduce the difference in pitch between wider and narrower pitch structures. The use of such dummy features, however, introduces drawbacks due to the presence of these structures in the final layout or produced chip. For example, the presence of these additional dummy structures may, in some cases, reduce the electrical performance of the chip. Similarly, dummy gate lines formed in source or drain regions hamper formation of contacts, thus restricting their use.

Another method of advantageously using printing assist features is provided by a technique called double patterning. In double patterning, the mask contains a number of additional features. These additional features such as dummy gate lines are printed along with critical features. The additional features are removed in a subsequent process step by exposing these additional features to a second mask step.

The use of printing assist features enables optimization of lithography process conditions to increase the common process window. For example, densely packed gates can be patterned in regions assigned to form both isolated transistors and densely packed transistor arrays. Hence, the isolated transistor region comprises the active gate line and a plurality of printing assist features or dummy gate lines. Isolated transistors are subsequently formed by removal of these dummy gate lines.

Embodiments provide a method to remove printing assist features, while at the same time opening up small or critical spaces using the second mask in a double patterning process. Embodiments achieve technical advantages by providing a method to simultaneously increase process margin, yield, and product performance using double patterning techniques. Embodiments may be applied to suitable types of devices including features such as diodes, bipolar junction transistors, thyristors, and memory devices such as DRAM, FeRAM, phase change memories, or floating gate devices. Similarly, embodiments may also be applied to other suitable types of devices in other applications and other technological fields. Embodiments may be implemented in many types of semiconductor devices, such as logic, memory, peripheral circuitry, power applications, and other suitable types of semiconductor devices.

FIG. 1 is a flow diagram illustrating one embodiment of a method 100 for fabricating a semiconductor device using a double patterning process. The flow diagram summarizes the steps of the double patterning process, which will be described in more detail below with reference to FIGS. 2A-2J. At 102, a material layer or stack of different materials to be patterned using the double patterning process is deposited onto a substrate or a previously formed layer. At 104, a mask material layer is deposited over the material layer. At 106, a first photoresist layer is deposited over the mask material layer. At 108, a first mask is used to expose the first photoresist layer. At 110, the first photoresist layer is developed and rinsed to provide a patterned first photoresist layer based on the first mask. At 112, the pattern of the first photoresist layer is transferred to the mask material layer by etching exposed portions of the mask material layer, thereby patterning the mask material layer. At 114, the remaining first photoresist layer is stripped.

At 116, a second photoresist layer is deposited over the patterned mask material layer. At 118, a second mask is used to expose the second photoresist layer. At 120, the second photoresist layer is developed and rinsed to provide a second patterned photoresist layer based on the second mask. At 122, the pattern of the second photoresist layer is transferred to the mask material layer by etching exposed portions of the mask material layer, thereby further patterning the mask material layer. At 124, the remaining second photoresist layer is stripped. At 126, the pattern of the mask material layer is transferred to the material layer or stack by etching exposed portions of the material layer or stack, thereby patterning the material layer or stack. In this way, the material layer or stack is formed using a double patterning process.

In one embodiment, the first mask is used to pattern the material layer to include first features including patterns for a semiconductor device and second features including printing assist features. The second mask is used to further pattern the material layer to effectively remove the second features and to define at least one separating structure between two first features. In one embodiment, the first and second features comprise lines and the separating structure is a space between two lines. In another embodiment, the first and second features are trenches and the separating structure is a line between two trenches.

Figure 2A:
FIG. 2A illustrates a cross-sectional view of one embodiment of a semiconductor wafer including a substrate, a first material layer, a mask material layer, and a first photoresist layer.

FIG. 2A illustrates a cross-sectional view of one embodiment of a semiconductor wafer 200a including a substrate 202, a first material layer 204, a mask material layer 206, and a first photoresist layer 208. Substrate 202 is a semiconductor substrate and may include any suitable structures for a semiconductor device. For example, substrate 202 may include isolation regions, source/drain regions, and channel regions for forming transistors.

As indicated at 102 of method 100 illustrated in FIG. 1, a material layer or stack of material layers are deposited over substrate 202 to provide first material layer 204. In other embodiments, first material layer 204 is deposited over other layers previously formed on substrate 202. In one embodiment, first material layer 204 is a gate stack layer for forming transistors and includes a poly-conductor (PC) layer. In other embodiments, first material layer 204 includes any suitable material that is to be patterned using a double patterning process, such as a metal layer, a via layer, or an insulator layer for a metal damascene process. First material layer 204 is deposited using chemical vapor deposition (CVD), high density plasma-chemical vapor deposition (HDP-CVD), atomic layer deposition (ALD), metal organic chemical vapor deposition (MOCVD), physical vapor deposition (PVD), jet vapor deposition (JVD), or other suitable deposition technique.

As indicated at 104 of method 100 illustrated in FIG. 1, a mask material, such as a resist material or hard mask material is deposited over first material layer 204 to provide mask material layer 206. Mask material layer 206 is deposited using spin-on, CVD, HDP-CVD, ALD, MOCVD, PVD, JVD, or other suitable deposition technique. In other embodiments, mask material layer 204 may be excluded and first material layer 204 may be patterned directly using the double patterning process without first patterning the mask material layer.

As indicated at 106 of method 100 illustrated in FIG. 1, a first photoresist layer 208 is then deposited over mask material layer 206. First photoresist layer 208 is a resist adapted to be developed by exposure to radiation such as deep ultraviolet (UV) radiation used by lithography tools. First photoresist layer 208 is sensitive to 193 nm, 157 nm, extreme ultraviolet electromagnetic radiation, or other suitable wavelength of radiation. The photoresist used may be either positive photoresist or negative photoresist for use with positive or negative tone develop processes and corresponding mask tones. In this embodiment, photoresist layer 208 is a positive photoresist.

Figure 2B:
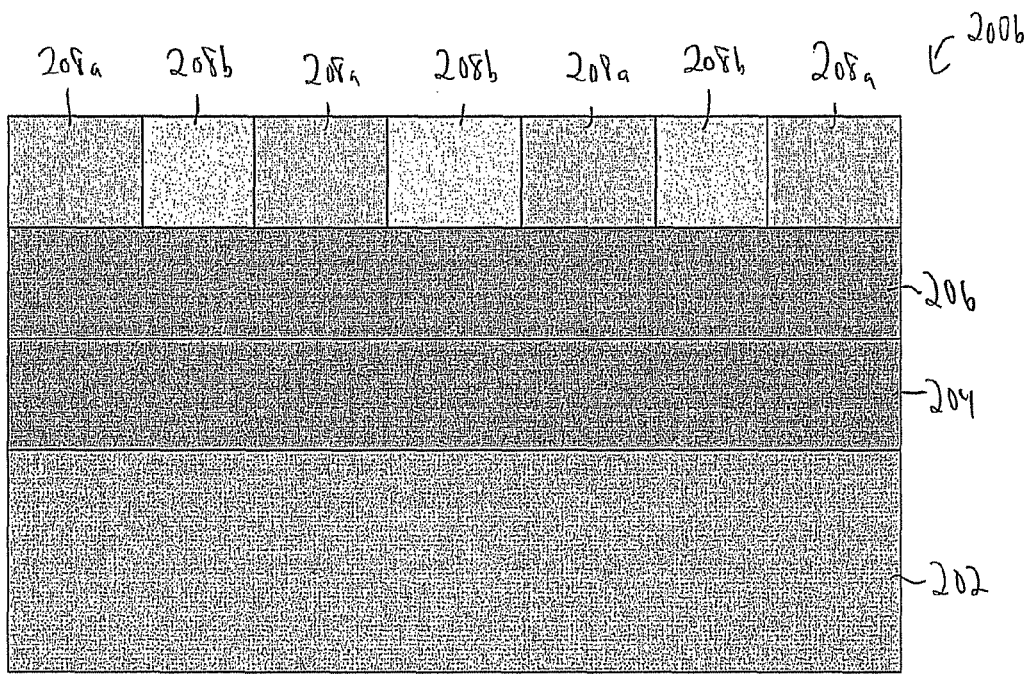
FIG. 2B illustrates a cross-sectional view of one embodiment of a semiconductor wafer including the substrate, the first material layer, the mask material layer, and the first photoresist layer after exposing the first photoresist layer using a first mask.

FIG. 2B illustrates a cross-sectional view of one embodiment of a semiconductor wafer 200b including substrate 202, first material layer 204, mask material layer 206, and first photoresist layer 208a, 208b after exposing the first photoresist layer 208 using a first mask. As indicated at 108 of method 100 illustrated in FIG. 1, first photoresist layer 208 is exposed using a first mask. The first mask includes patterns for forming desired device features and printing assist features. Regions 208a of the first photoresist layer are exposed by the lithography while regions 208b of the first photoresist layer remain unexposed.

Figure 2C:
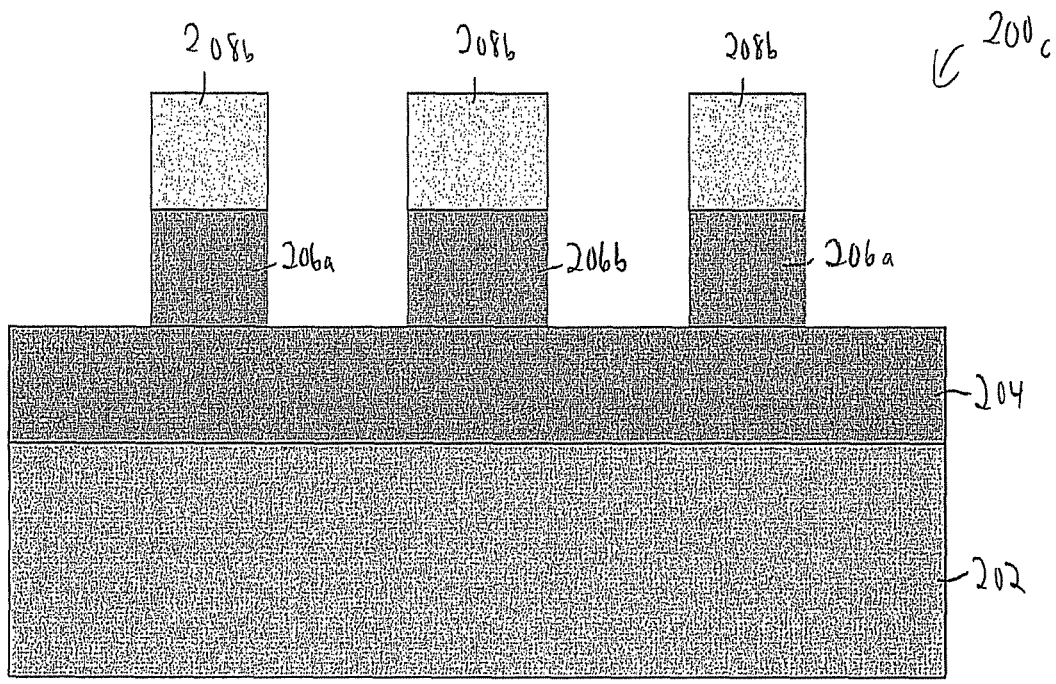
FIG. 2C illustrates a cross-sectional view of one embodiment of a semiconductor wafer including the substrate, the first material layer, the mask material layer, and the first photoresist layer after developing and rinsing the first photoresist layer and etching the mask material layer.

FIG. 2C illustrates a cross-sectional view of one embodiment of a semiconductor wafer 200c including substrate 202, first material layer 204, mask material layer 206a, 206b, and first photoresist layer 208b after developing and rinsing first photoresist layer 208a, 208b and etching mask material layer 206.

As indicated at 110 of method 100 illustrated in FIG. 1, first photoresist layer 208a, 208b is developed and rinsed such that regions 208a of the first photoresist layer are removed. With regions 208a of the first photoresist layer removed, portions of mask material layer 206 are exposed. As indicated at 112 of method 100 illustrated in FIG. 1, the exposed portions of mask material layer 206 not covered by regions 208b of the first photoresist layer are etched to provide a patterned mask material layer including features 206a and 206b. The exposed portions of mask material layer 206 are etched using an anisotropic etch (e.g., a reactive ion etch) or other suitable etch. In this embodiment, features 206a of the mask material layer include printing assist features, and features 206b of the mask material layer are for defining the desired device features.

Figure 2D:
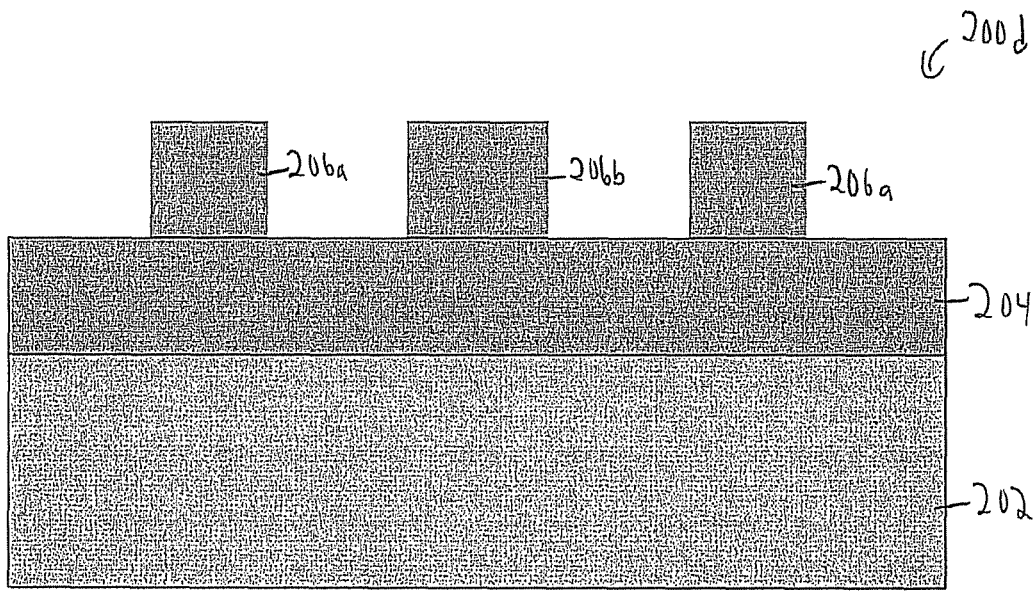
FIG. 2D illustrates a cross-sectional view of one embodiment of a semiconductor wafer including the substrate, the first material layer, and the mask material layer after stripping the first photoresist layer.

FIG. 2D illustrates a cross-sectional view of one embodiment of semiconductor wafer 200d including substrate 202, first material layer 204, and mask material layer 206a, 206b after stripping first photoresist layer 208b. As indicated at 114 of method 100 illustrated in FIG. 1, the remaining portions 208b of the first photoresist layer are stripped to expose mask material layer 206a, 206b.

Figure 2E:
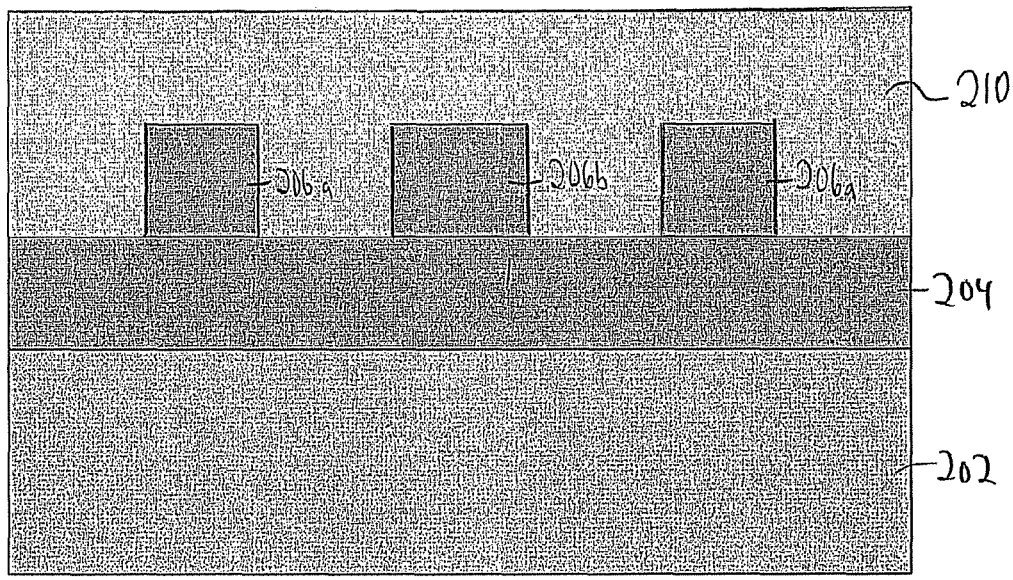
FIG. 2E illustrates a cross-sectional view of one embodiment of a semiconductor wafer including the substrate, the first material layer, the mask material layer, and a second photoresist layer.

FIG. 2E illustrates a cross-sectional view of one embodiment of a semiconductor wafer 200e including substrate 202, first material layer 204, mask material layer 206a, 206b, and a second photoresist layer 210. As indicated at 116 of method 100 illustrated in FIG. 1, a second photoresist layer 210 is then deposited over mask material layer 206a, 206b and first material layer 204. In one embodiment, the second photoresist layer 210 has the same properties as the first photoresist layer.

Figure 2F:
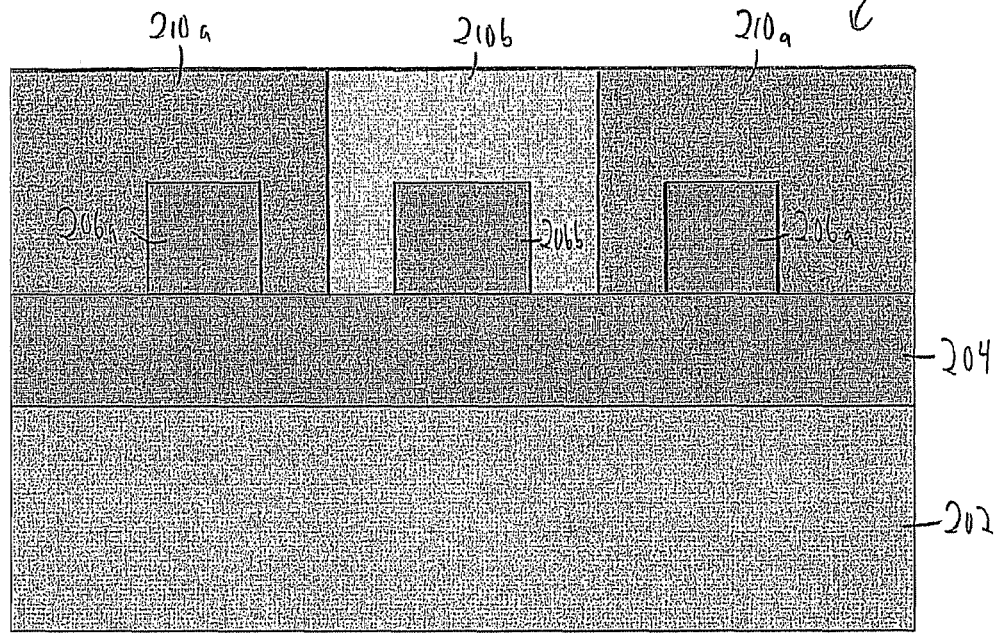
FIG. 2F illustrates a cross-sectional view of one embodiment of a semiconductor wafer including the substrate, the first material layer, the mask material layer, and the second photoresist layer after exposing the second photoresist layer using a second mask.

FIG. 2F illustrates a cross-sectional view of one embodiment of a semiconductor wafer 200f including substrate 202, first material layer 204, mask material layer 206a, 206b, and second photoresist layer 210a, 210b after exposing second photoresist layer 210 using a second mask. As indicated at 118 of method 100 illustrated in FIG. 1, second photoresist layer 210 is exposed using a second mask. The second mask is a so called cut mask for removing the printing assist features. In addition, as described in more detail below with reference to FIGS. 10 and 13, the second mask may be used to open small or critical spaces in the photoresist to define separating structures. Regions 210a of the second photoresist layer are exposed by the lithography while regions 210b of the second photoresist layer remain unexposed.

Figure 2G:
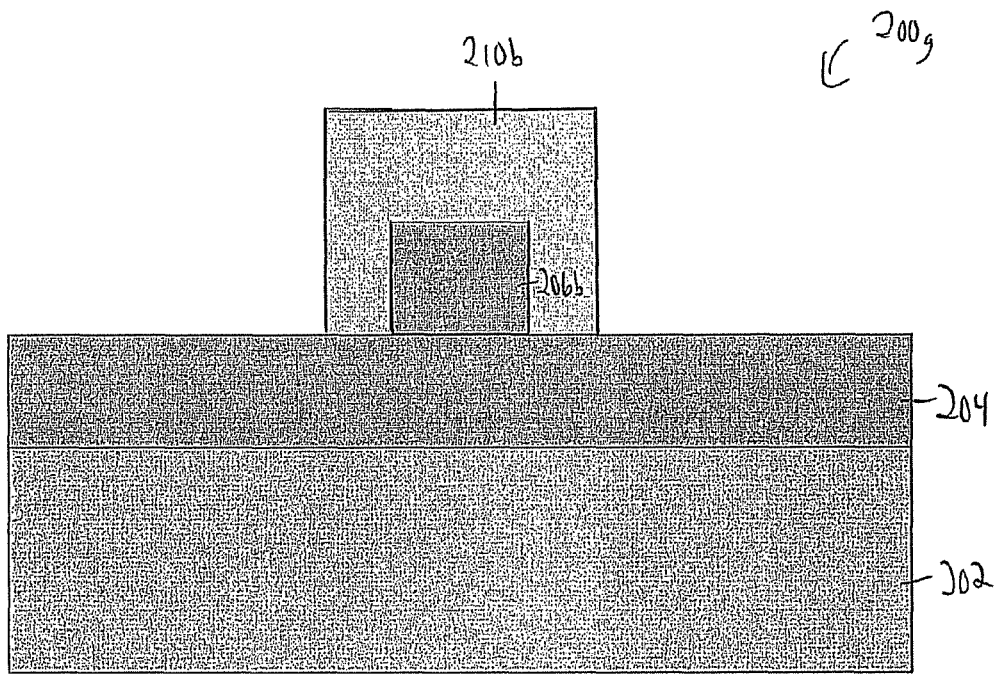
FIG. 2G illustrates a cross-sectional view of one embodiment of a semiconductor wafer including the substrate, the first material layer, the mask material layer, and the second photoresist layer after developing and rinsing the second photoresist layer and etching the mask material layer.

FIG. 2G illustrates a cross-sectional view of one embodiment of a semiconductor wafer 200g including substrate 202, first material layer 204, mask material layer 206b, and second photoresist layer 210b after developing and rinsing second photoresist layer 210a, 210b and etching mask material layer 206a, 206b. As indicated at 120 of method 100 illustrated in FIG. 1, second photoresist layer 210a, 210b is developed and rinsed such that regions 210a of the second photoresist layer are removed. With regions 210a of the second photoresist layer removed, the printing assist features 206a of the mask material layer are exposed.

As indicated at 122 of method 100 illustrated in FIG. 1, the exposed portions of mask material layer 206a, 206b (i.e., printing assist features 206a) not covered by regions 210b of the second photoresist layer are etched to provide a patterned mask material layer including features 206b. The exposed portions of the mask material layer are etched using an anisotropic etch (e.g., a reactive ion etch) or other suitable etch. As previously described above, features 206b are for defining the desired device features.

Figure 2H:
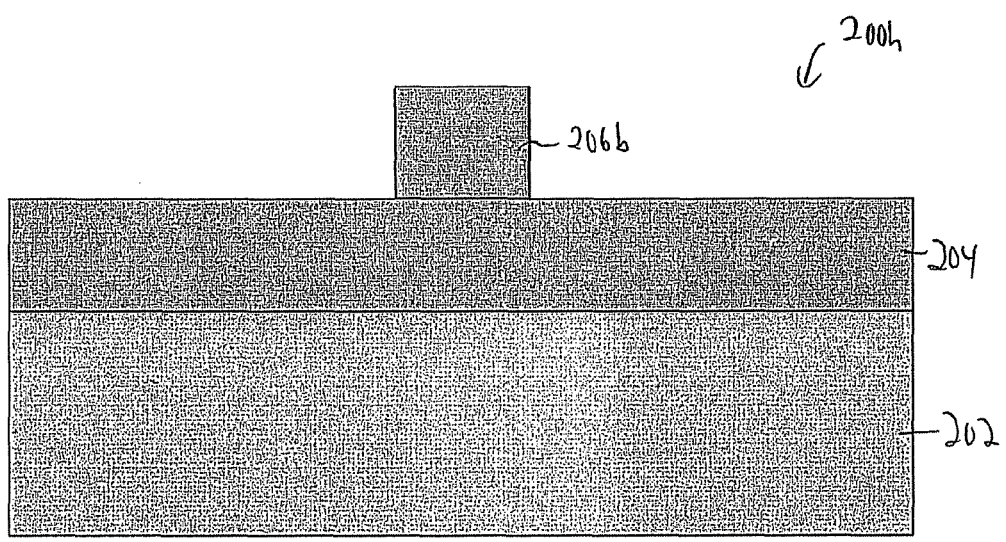
FIG. 2H illustrates a cross-sectional view of one embodiment of a semiconductor wafer including the substrate, the first material layer, and the mask material layer after stripping the second photoresist layer.

FIG. 2H illustrates a cross-sectional view of one embodiment of a semiconductor wafer 200h including substrate 202, first material layer 204, and mask material layer 206b after stripping second photoresist layer 210b. As indicated at 124 of method 100 illustrated in FIG. 1, the remaining portions 210b of the second photoresist layer are stripped to expose mask material layer 206b.

Figure 2I:
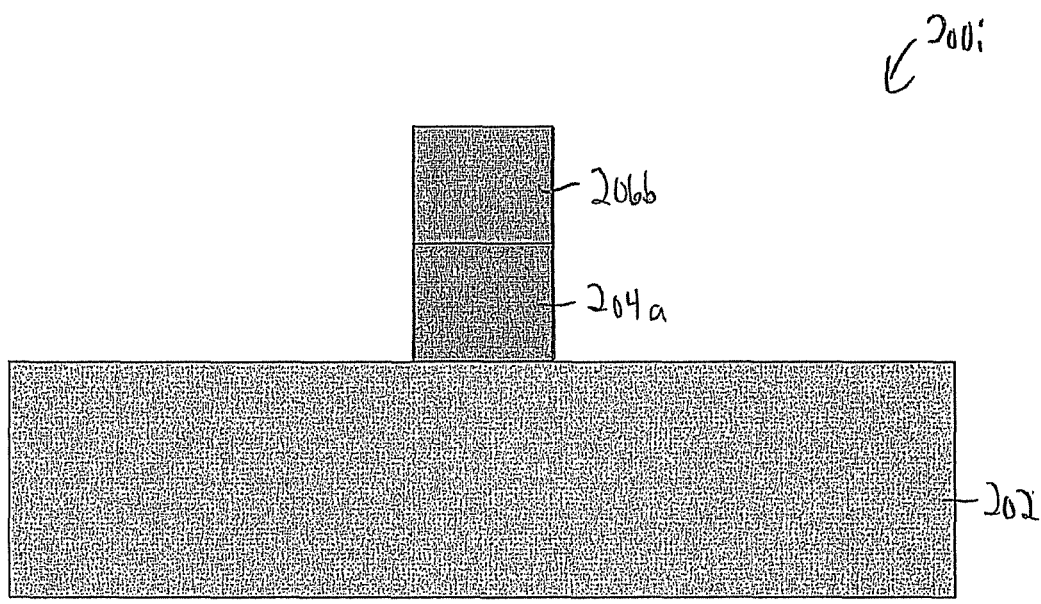
FIG. 2I illustrates a cross-sectional view of one embodiment of a semiconductor wafer including the substrate, the first material layer, and the mask material layer after etching the first material layer.

FIG. 2I illustrates a cross-sectional view of one embodiment of a semiconductor wafer 200i including substrate 202, first material layer 204a, and mask material layer 206b after etching first material layer 204. As indicated at 126 of method 100 illustrated in FIG. 1, the exposed portions of first material layer 204 are etched to provide patterned first material layer 204a. The exposed portions of first material layer 204 are etched using an anisotropic etch (e.g., a reactive ion etch) or other suitable etch.

Figure 2J:
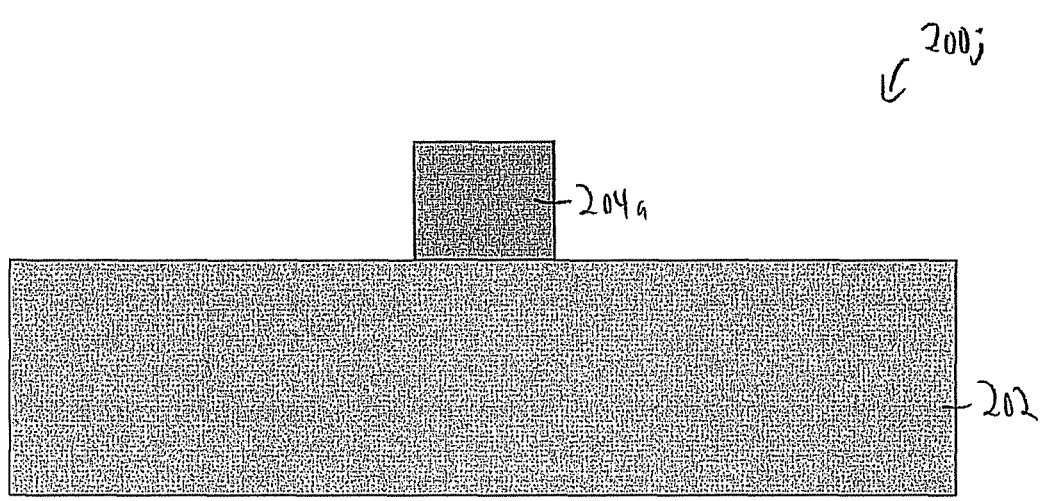
FIG. 2J illustrates a cross-sectional view of one embodiment of a semiconductor wafer including the substrate and the first material layer after removing the mask material layer.

FIG. 2J illustrates a cross-sectional view of one embodiment of a semiconductor wafer 200j including substrate 202 and first material layer 204a after removing mask material layer 206b. The remaining portions 206b of the mask material layer are removed by etching or other suitable technique to complete the double patterning process of first material layer 204a. First material layer 204a provides a desired device feature for a semiconductor device (e.g., a gate stack). Additional processes may then be used to form additional layers of the semiconductor device.

Figure 3:
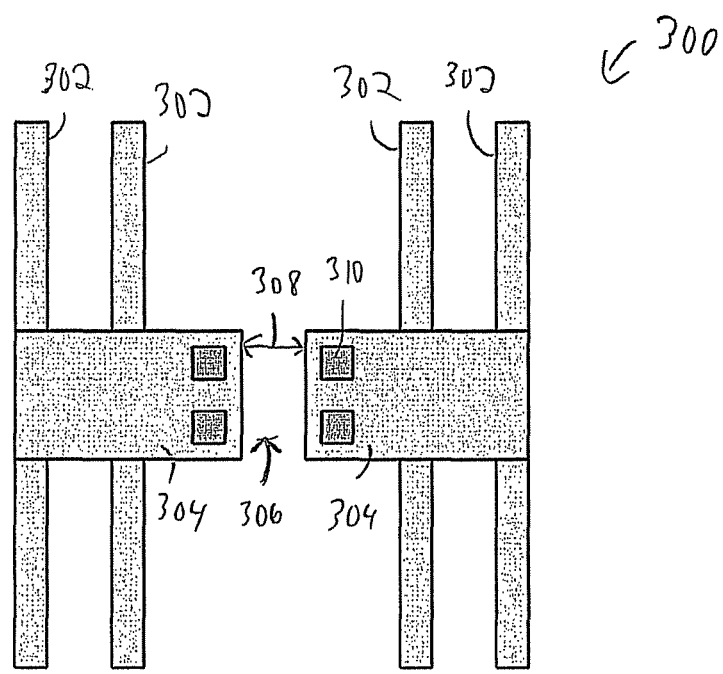
FIG. 3 illustrates a top view of one embodiment of a material layer of a semiconductor device.

FIG. 3 illustrates a top view of one embodiment of a material layer 300 of a semiconductor device. In one embodiment, material layer 300 is patterned by using method 100 previously described and illustrated with reference to FIGS. 1-2J. Material layer 300 includes a plurality of device features 302 and 304. In one embodiment, material layer 300 is a patterned poly-conductor layer for providing gate lines for transistors of a semiconductor device. In other embodiments, material layer 300 is any suitable layer for a semiconductor device, such as a metal layer, a via layer, or an insulator layer for a metal damascene process.

In this embodiment, material layer 300 includes device features 302 and 304. Device features 302 include parallel lines. The width of lines 302 are near or at the critical dimension, thus printing assist features are used for patterning lines 302. Device features 304 electrically couple two lines 302 to each other and to a contact layer indicated at 310. Between device features 304 is a critical or small space or separating structure 306 having a width 308 at or near the critical dimension. Small space 306 is difficult to resolve robustly using conventional lithography techniques.

Figure 4:
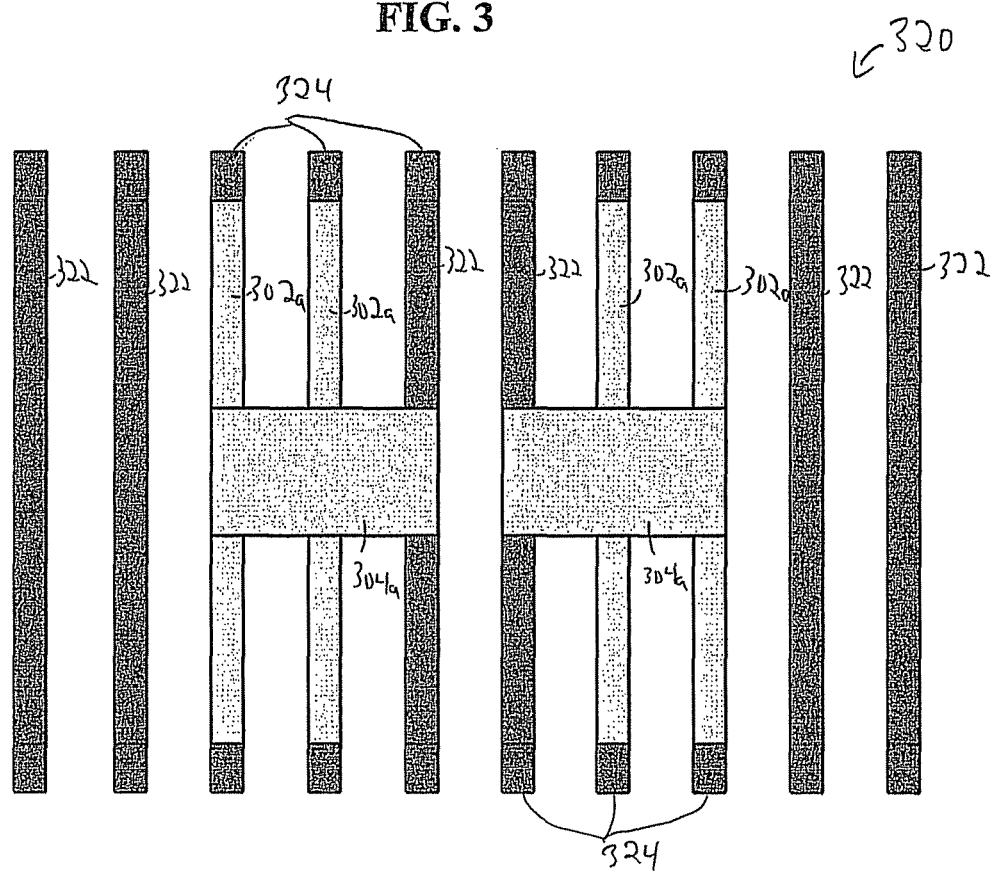
FIG. 4 illustrates a top view of one embodiment of a material layer of a semiconductor wafer including device features, printing assist features, and line end extensions.

FIG. 4 illustrates a top view of one embodiment of a material layer 320 of a semiconductor wafer including device features 302a and 304a, printing assist features 322, and line end extensions 324. In one embodiment, material layer 320 is a mask material layer used to pattern material layer 300 previously described and illustrated with reference to FIG. 3. To optimize the lithography process conditions to increase the common process window, printing assist features 322 and line end extensions 324 are patterned along with device features 302a and 304a to provide patterned material layer 320.

Printing assist features 322 include lines parallel to lines 302a and are patterned on both sides of each pair of lines 302a coupled by features 304a. Printing assist features 322 are used to improve the accuracy and precision of patterned lines 302a. Line end extensions 324 extend lines 302a. Line end extensions 324 are used to form square line ends on lines 302a instead of oval or circular line ends that are formed when using a single exposure process. The square line ends enable adjacent lines ends to be brought closer together, thus saving space on the semiconductor device.

Figure 5:
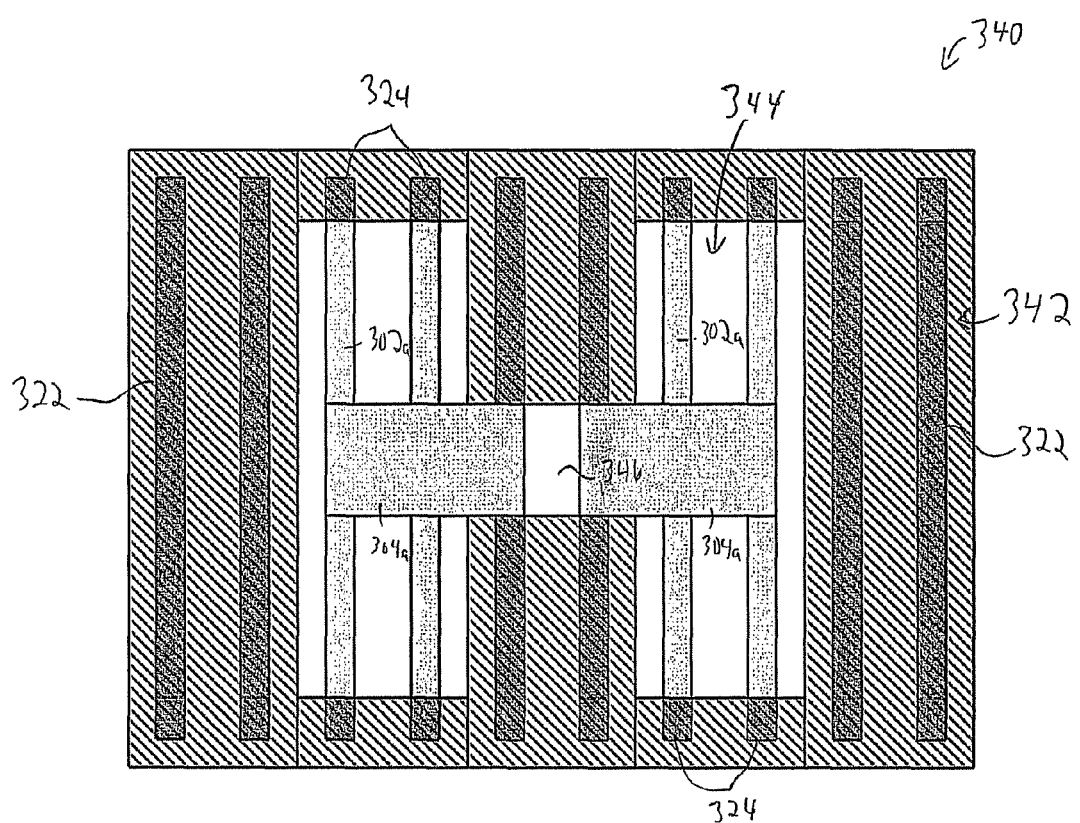
FIG. 5 illustrates a top view of one embodiment of a material layer of a semiconductor wafer indicating a cut mask area.

FIG. 5 illustrates a top view of one embodiment of a material layer 340 of a semiconductor device indicating a cut mask area. The cut mask area is indicated at 342. The cut mask area covers printing assist features 322 and line end extensions 324 for removing printing assist features 322 and line end extensions 324 during the second exposure/patterning process. The area indicated at 344, which is not covered by cut mask area 342, remains on the wafer for providing desired device features 302a and 304a. In this embodiment, small space 346 between features 304a is part of the area indicated at 344 that is not covered by cut mask area 342.

Figure 6:
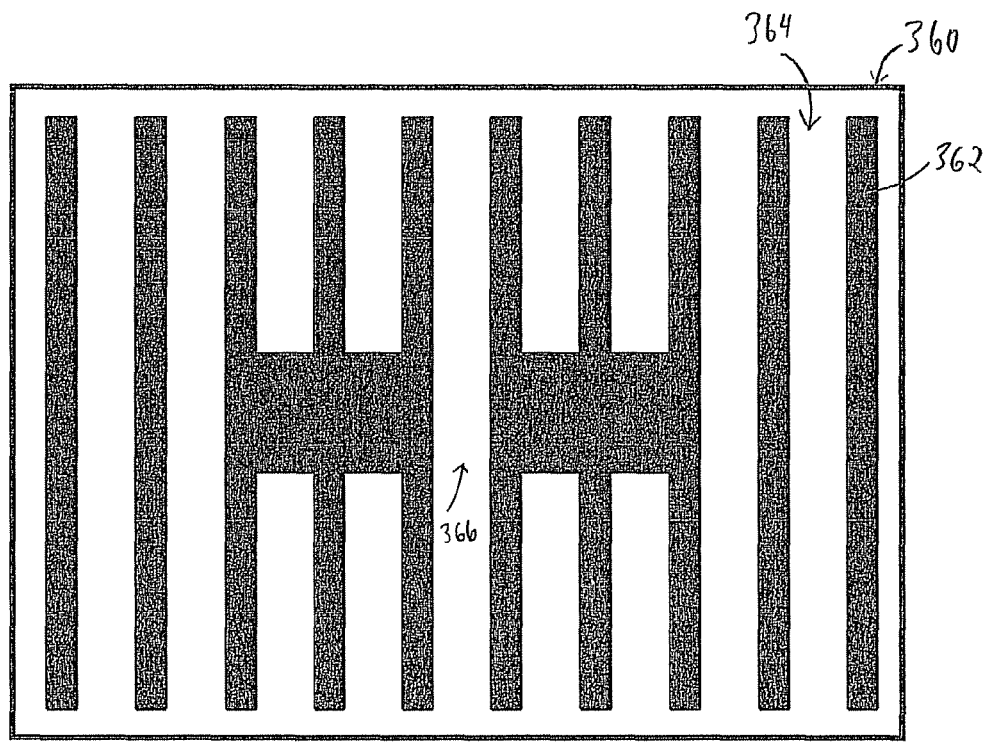
FIG. 6 is a diagram illustrating one embodiment of a first mask layout used to pattern device features, printing assist features, and line end extensions.

FIG. 6 is a diagram illustrating one embodiment of a first mask layout 360 used to pattern device features, printing assist features, and line end extensions during the first exposure/patterning process of the double exposure/patterning process. First mask layout 360 is used to pattern devices features 302a and 304a, printing assist features 322, and line end extensions 324 of layer 320 as previously described and illustrated with reference to FIG. 4. First mask layout 360 is subject to OPC and other layout lithography target biasing steps to derive the actual layout that is transferred on the first mask.

First mask layout 360 includes transparent regions 364 for exposing portions of the first photoresist layer and opaque regions 362 for blocking the exposure of portions of the first photoresist layer. In this embodiment, first mask layout 360 includes a transparent portion at 366 for exposing the first photoresist layer at the space between device features 304a so that the space is printed with the first exposure.

Figure 7:
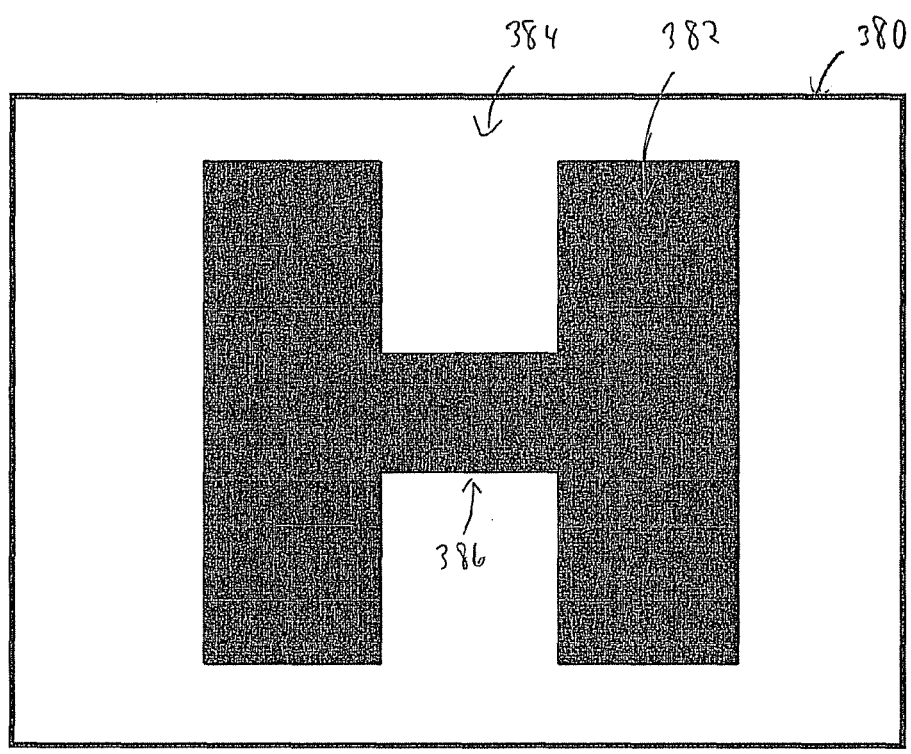
FIG. 7 is a diagram illustrating one embodiment of a second mask layout used to remove the printing assist features and line end extensions.

FIG. 7 is a diagram illustrating one embodiment of a second mask layout 380 used to remove the printing assist features and the line end extensions during the second exposure/patterning process of the double exposure/patterning process. Second mask layout 380 is used to remove printing assist features 322 and line end extensions 324 of layer 320 as previously described and illustrated with reference to FIG. 4. Second mask layout 380 is subject to OPC and other layout lithography target biasing steps to derive the actual layout that is transferred on the second mask.

Second mask layout 380 includes transparent regions 384 for exposing portions of the second photoresist layer and opaque regions 382 for blocking the exposure of portions of the second photoresist layer. As indicated in FIG. 5, the transparent regions 384 of second mask layout 380 define the cut area 342. In this embodiment, second mask layout 380 includes an opaque portion at 386 for blocking exposure of the second photoresist layer at the space between device features 304a. Accordingly, in the double exposure/patterning process using first mask layout 360 and second mask layout 380, the small space 306 previously described and illustrated with reference to FIG. 3 is defined by the first mask in the first exposure/patterning process.

Figure 8:
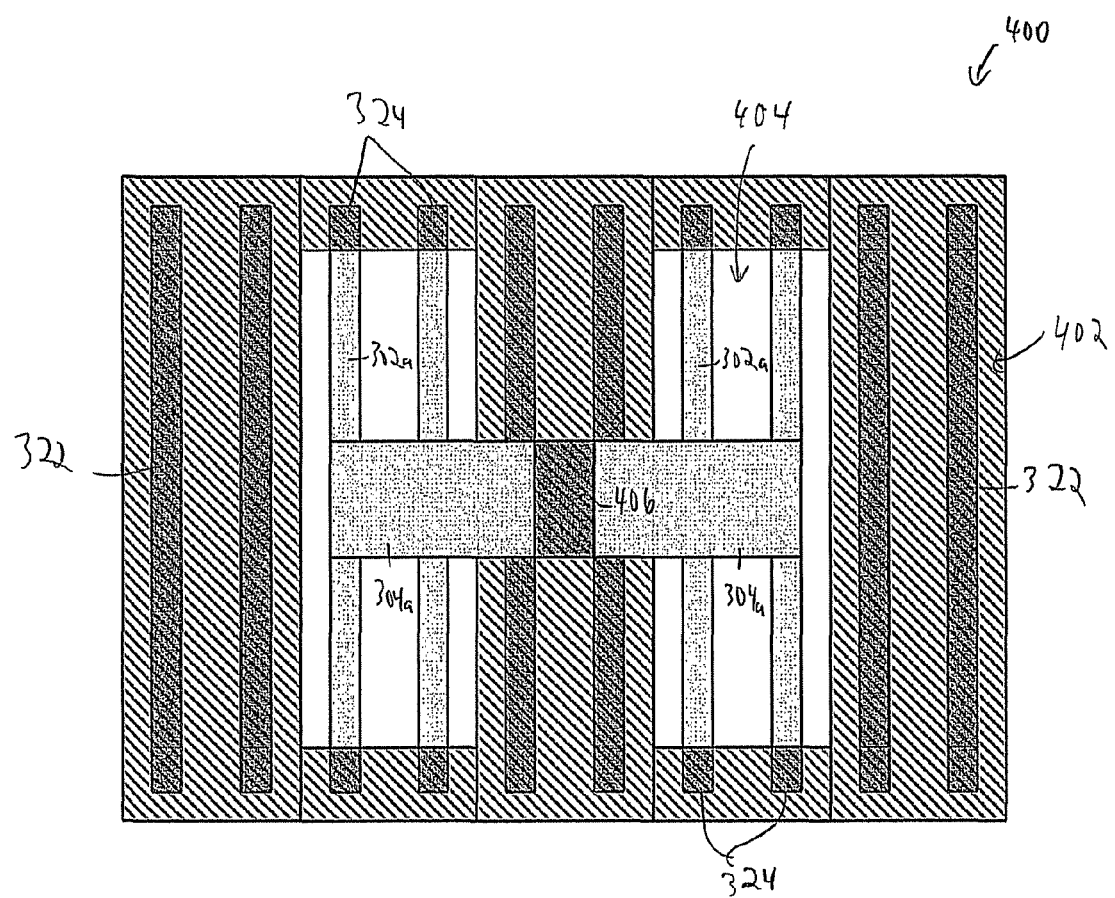
FIG. 8 illustrates a top view of one embodiment of a material layer of a semiconductor wafer indicating a cut mask area.

FIG. 8 illustrates a top view of one embodiment of a material layer 400 of a semiconductor device indicating a cut mask area. The cut mask area is indicated at 402. The cut mask area covers printing assist features 322 and line end extensions 324 for removing printing assist features 322 and line end extensions 324 during the second exposure/patterning process. The area indicated at 404, which is not covered by cut mask area 402, remains on the wafer for providing desired device features 302a and 304a.

In this embodiment, an additional printing assist feature 406 connecting device features 304a is part of patterned material layer 400. This printing assist feature 406 is also within the area covered by cut mask area 402. Accordingly, in contrast to patterned material layer 340 previously described and illustrated with reference to FIG. 5 where small space 346 is defined during the first exposure/patterning process, in patterned material layer 400 the small space between device features 304a is not defined during the first exposure/patterning process.

Figure 9:
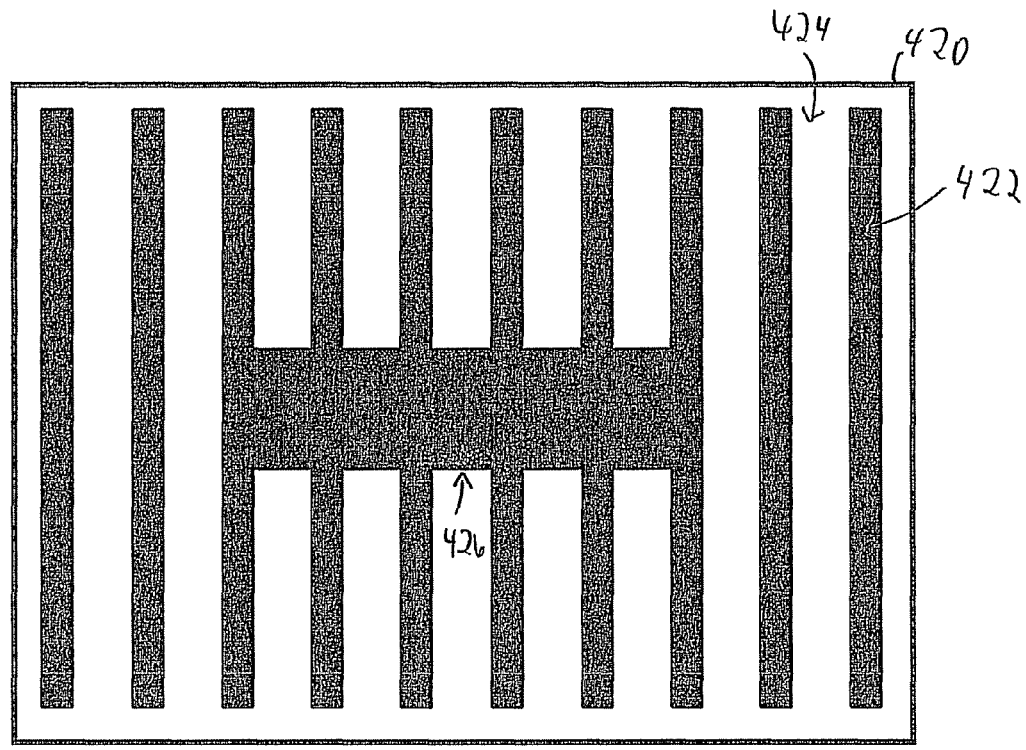
FIG. 9 is a diagram illustrating one embodiment of a first mask layout used to pattern device features, printing assist features, and line end extensions.

FIG. 9 is a diagram illustrating one embodiment of a first mask layout 420 used to pattern device features, printing assist features, and line end extensions during the first exposure/patterning process of the double exposure/patterning process. First mask layout 420 is used to pattern devices features 302a and 304a, printing assist features 322 and 406, and line end extensions 324 of layer 400 as previously described and illustrated with reference to FIG. 8. Unlike first mask layout 360 previously described and illustrated with reference to FIG. 6, first mask layout 420 does not define the small space between device features 304a. First mask layout 420 is subject to OPC and other layout lithography target biasing steps to derive the actual layout that is transferred on the first mask.

First mask layout 420 includes transparent regions 424 for exposing portions of the first photoresist layer and opaque regions 422 for blocking the exposure of portions of the first photoresist layer. In this embodiment, first mask layout 420 includes an opaque portion at 426 for preventing exposure of the first photoresist layer at the space between device features 304a.

Figure 10:
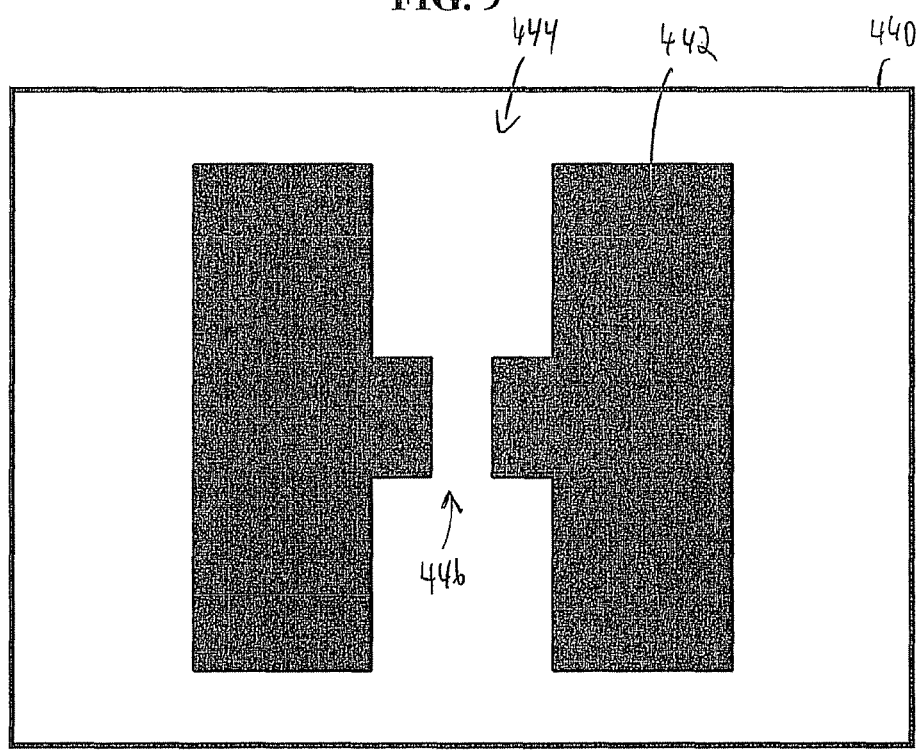
FIG. 10 is a diagram illustrating one embodiment of a second mask layout used to remove the printing assist features and line end extensions and to define an opening in the material layer of the semiconductor wafer.

FIG. 10 is a diagram illustrating one embodiment of a second mask layout 440 used to remove the printing assist features and line end extensions and to define an opening in the material layer of the semiconductor wafer during the second exposure/patterning process of the double exposure/patterning process. Second mask layout 440 is used to remove printing assist features 322 and 406 and line end extensions 324 of layer 400 as previously described and illustrated with reference to FIG. 8. Second mask layout 440 is subject to OPC and other layout lithography target biasing steps to derive the actual layout that is transferred on the second mask.

Second mask layout 440 includes transparent regions 444 for exposing portions of the second photoresist layer and opaque regions 442 for blocking the exposure of portions of the second photoresist layer. As indicated in FIG. 8, the transparent regions 444 of second mask layout 440 define the cut area 402. In this embodiment, second mask layout 440 includes a transparent portion at 446 for exposing the second photoresist layer at the space between device features 304a. Compared to the double exposure/patterning process using first mask layout 360 and second mask layout 380 previously described and illustrated with reference to FIGS. 6 and 7, respectively, the double exposure/patterning process using first mask layout 420 and second mask layout 440 improves the robustness of small space 306 of patterned material layer 300 previously described and illustrated with reference to FIG. 3.

Figure 11:
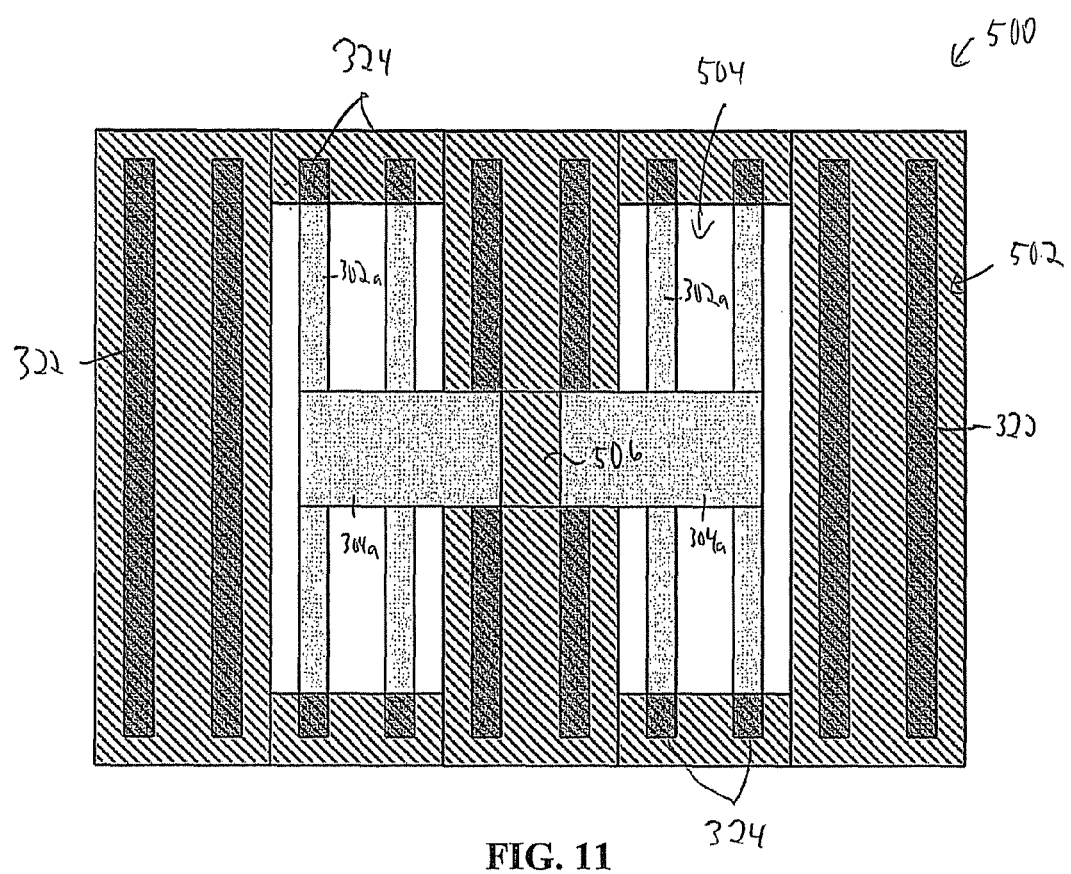
FIG. 11 illustrates a top view of another embodiment of a material layer of a semiconductor wafer indicating a cut mask area.

FIG. 11 illustrates a top view of another embodiment of a material layer 500 of a semiconductor device indicating a cut mask area. The cut mask area is indicated at 502. The cut mask area covers printing assist features 322 and line end extensions 324 for removing printing assist features 322 and line end extensions 324 during the second exposure/patterning process. The area indicated at 504, which is not covered by cut mask area 502, remains on the wafer for providing desired device features 302a and 304a.

In this embodiment, small space 506 between features 304a is within the area covered by cut mask area 502. Accordingly, similarly to patterned material layer 340 previously described and illustrated with reference to FIG. 5 where small space 346 is defined during the first exposure/patterning process, in patterned material layer 500 the small space between device features 304a is also defined during the first exposure/patterning process. In this embodiment, however, unlike small space 346 previously described and illustrated with reference to FIG. 5, small space 506 does not have to be effectively defined during the first exposure/patterning process.

Figure 12:
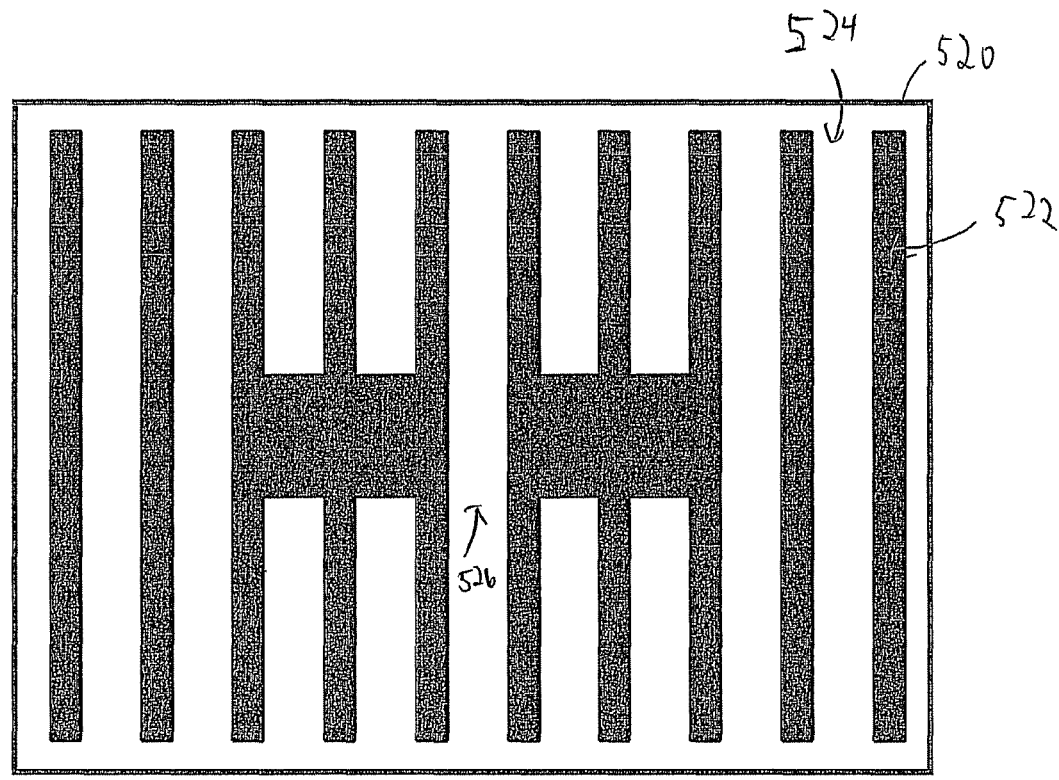
FIG. 12 is a diagram illustrating another embodiment of a first mask layout used to pattern device features, printing assist features, and line end extensions.

FIG. 12 is a diagram illustrating another embodiment of a first mask layout 520 used to pattern device features, printing assist features, and line end extensions during the first exposure/patterning process of the double exposure/patterning process. First mask layout 520 is used to pattern devices features 302a and 304a, printing assist features 322, and line end extensions 324 of layer 500 as previously described and illustrated with reference to FIG. 11. First mask layout 520 is subject to OPC and other layout lithography target biasing steps to derive the actual layout that is transferred on the first mask.

First mask layout 520 includes transparent regions 524 for exposing portions of the first photoresist layer and opaque regions 522 for blocking the exposure of portions of the first photoresist layer. In this embodiment, first mask layout 520 includes a transparent portion at 526 for exposing the first photoresist layer at the space between device features 304a.

Figure 13:
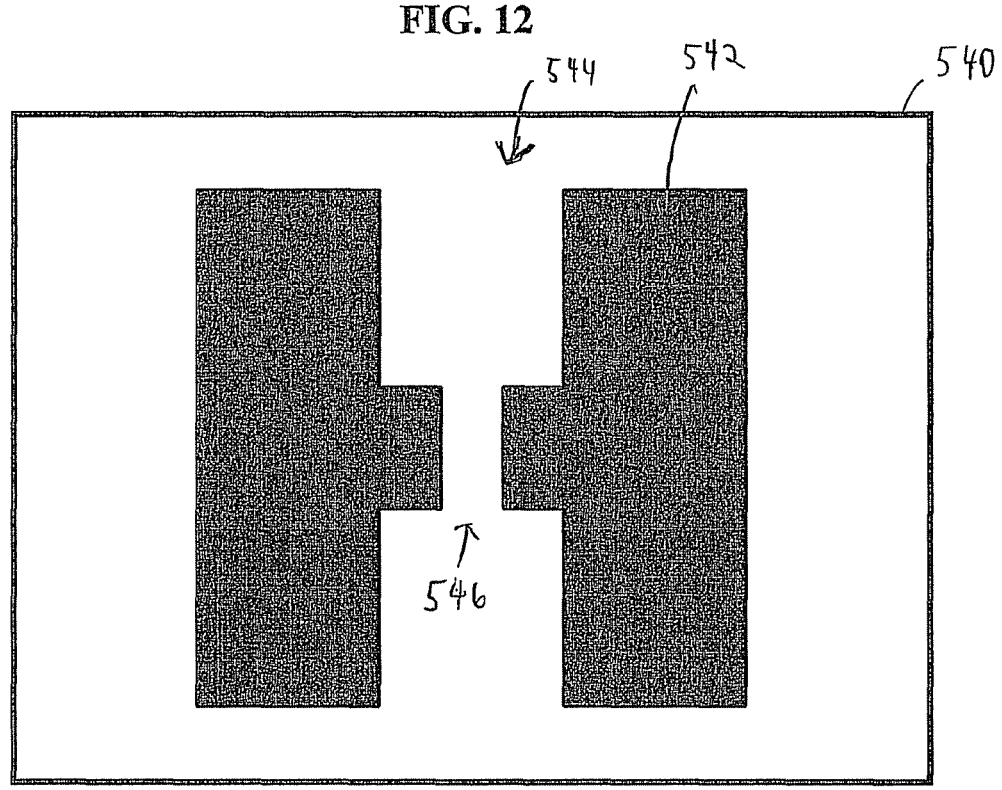
FIG. 13 is a diagram illustrating another embodiment of a second mask layout used to remove the printing assist features and line end extensions and to further define an opening in the material layer of the semiconductor wafer.

FIG. 13 is a diagram illustrating another embodiment of a second mask layout 540 used to remove the printing assist features and line end extension and to further define an opening in the material layer of the semiconductor wafer during the second exposure/patterning process of the double exposure/patterning process. Second mask layout 540 is used to remove printing assist features 322 and line end extensions 324 of layer 500 as previously described and illustrated with reference to FIG. 11. Second mask layout 540 is subject to OPC and other layout lithography target biasing steps to derive the actual layout that is transferred on the second mask.

Second mask layout 540 includes transparent regions 544 for exposing portions of the second photoresist layer and opaque regions 542 for blocking the exposure of portions of the second photoresist layer. As indicated in FIG. 11, the transparent regions 544 of second mask layout 540 define the cut area 502. In this embodiment, second mask layout 540 includes a transparent portion at 546 for exposing the second photoresist layer at the space between device features 304a. Compared to the double exposure/patterning process using first mask layout 360 and second mask layout 380 previously described and illustrated with reference to FIGS. 6 and 7, respectively, the double exposure/patterning process using first mask layout 520 and second mask layout 540 improves the robustness of small space 306 of patterned material layer 300 previously described and illustrated with reference to FIG. 3.

Embodiments provide a double exposure/patterning process wherein in addition to removing printing assist features using the second exposure/patterning process, critical spaces or separating structures at or close to the resolution limit are also defined using the second exposure/patterning process. Advantageously, while the first exposure can be optimized for the printing of relatively dense line features, which makes the printing of small isolated spaces more challenging, the second exposure can be optimized for the resolution of small spaces. Therefore, the transfer robustness (i.e., the process window) of the small spaces is improved.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A method for fabricating a semiconductor device, the method comprising:
   depositing a first material layer over a semiconductor substrate;
   depositing a mask material layer over the first material layer;
   depositing a first photoresist layer over the mask material layer;
   exposing the first photoresist layer using a first mask to pattern the first photoresist layer;
   developing and rinsing the first photoresist layer to expose first portions of the mask material layer;
   etching the exposed first portions of the mask material layer thereby forming a plurality of first and second features, wherein the first features comprise patterns for the semiconductor device and the second features comprise printing assist features;
   stripping the first photoresist layer;
   depositing a second photoresist layer over the etched mask material layer;
   exposing the second photoresist layer using a second mask to pattern the second photoresist layer;
   developing and rinsing the second photoresist layer to expose second portions of the etched mask material layer;
   etching the exposed second portions of the etched mask material layer thereby removing the second features and end extensions of the first features and forming at least one space between the first features;
   stripping the second photoresist layer; and
   etching exposed portions of the first material layer to transfer the pattern of the mask material layer to the first material layer.

2. The method of claim 1, wherein the first material layer comprises one of a poly-conductor layer, a metal layer, and an insulator layer for a metal damascene process.

3. A method for fabricating a semiconductor device, the method comprising:
   depositing a first material layer over a semiconductor substrate;
   depositing a mask material layer over the first material layer;
   depositing a first photoresist layer over the mask material layer;
   exposing the first photoresist layer using a first mask to pattern the first photoresist layer;
   developing and rinsing the first photoresist layer to expose first portions of the mask material layer;
   etching the exposed first portions of the mask material layer thereby forming a plurality of first and second features, wherein the first features comprise patterns for the semiconductor device and the second features comprise printing assist features;
   stripping the first photoresist layer;
   depositing a second photoresist layer over the etched mask material layer and exposed portions of the first material layer,
   exposing the second photoresist layer using a second mask to pattern the second photoresist layer;

developing and rinsing the second photoresist layer to expose second portions of the mask material layer and portions of the first material layer;

etching the exposed portions of the first material layer thereby forming the first features and at least one line between the first features in the first material layer with the second features comprising printing assist features protected from being etched;

stripping the second photoresist layer; and stripping the mask material layer.

4. The method of claim 3, wherein the first material layer comprises one of a contact layer, a via layer, and an insulator layer for a metal damascene process.

5. A method for fabricating a semiconductor device, the method comprising:

depositing a first material layer over a semiconductor substrate;

depositing a mask material layer over the first material layer;

depositing a first photoresist layer over the mask material layer;

exposing the first photoresist layer using a first mask to pattern the first photoresist layer;

developing and rinsing the first photoresist layer to expose first portions of the mask material layer;

etching the exposed first portions of the mask material layer thereby forming a plurality of first features and at least one space between the first features;

stripping the first photoresist layer;

depositing a second photoresist layer over the etched mask material layer;

exposing the second photoresist layer using a second mask to pattern the second photoresist layer, the second mask including patterns for the semiconductor device and printing assist features;

developing and rinsing the second photoresist layer to expose second portions of the etched mask material layer;

etching the exposed second portions of the etched mask material layer thereby forming the patterns for the semiconductor device;

stripping the second photoresist layer; and etching exposed portions of the first material layer to transfer the pattern of the mask material layer to the first material layer.

6. The method of claim 5, wherein the first material layer comprises one of a poly-conductor layer, a metal layer, and an insulator layer for a metal damascene process.

7. A method for fabricating a semiconductor device, the method comprising:

depositing a first material layer over a semiconductor substrate;

depositing a mask material layer over the first material layer;

depositing a first photoresist layer over the mask material layer;

exposing the first photoresist layer using a first mask to pattern the first photoresist layer;

developing and rinsing the first photoresist layer to expose first portions of the mask material layer;

etching the exposed first portions of the mask material layer thereby forming a plurality of first features and at least one line between the first features;

stripping the first photoresist layer;

depositing a second photoresist layer over the etched mask material layer;

exposing the second photoresist layer using a second mask to pattern the second photoresist layer, the second mask including patterns for the semiconductor device and printing assist features;

developing and rinsing the second photoresist layer to expose second portions of the mask material layer and portions of the first material layer;

etching the exposed second portions of the mask material layer and the exposed portions of the first material layer thereby forming the patterns for the semiconductor device in the first material layer and the second features comprising printing assist features in the mask material layer;

stripping the second photoresist layer; and stripping the mask material layer.

8. The method of claim 7, wherein the first material layer comprises one of a contact layer, a via layer, and an insulator layer for a metal damascene process.

* * * * *